United States Patent [19]

Park et al.

[11] Patent Number: 5,527,719
[45] Date of Patent: Jun. 18, 1996

[54] PROCESS FOR MAKING A SEMICONDUCTOR MOS TRANSISTOR USING A FLUID MATERIAL

[75] Inventors: Gum-Jin Park, Inchun-si; Chang-Jae Lee, Chungcheongbuk-do; Won-Hyuk Lee, Seoul, all of Rep. of Korea

[73] Assignee: Goldstar Electron Co., Ltd., Cheongju, Rep. of Korea

[21] Appl. No.: 357,950

[22] Filed: Dec. 16, 1994

[30] Foreign Application Priority Data

Dec. 16, 1993 [KR] Rep. of Korea ............ 93-28015

[51] Int. Cl.$^6$ .................................................. H01L 21/266
[52] U.S. Cl. ........................ 437/25; 437/44; 437/982
[58] Field of Search ................................. 437/25, 28, 29, 437/240, 982, 44; 148/DIG. 133

[56] References Cited

U.S. PATENT DOCUMENTS

| | | | |
|---|---|---|---|
| 4,755,479 | 7/1988 | Miura | 437/44 |
| 4,795,718 | 1/1989 | Beitman | 437/982 |
| 5,284,800 | 2/1994 | Lien et al. | 437/982 |

*Primary Examiner*—Chandra Chaudhari
*Attorney, Agent, or Firm*—Alan R. Loudermilk

[57] ABSTRACT

A process for formation of an MOS semiconductor device having an LDD structure is disclosed, which may include the steps of: forming an active region and an isolation region on a semiconductor substrate; forming a first insulating layer on the surface of the substrate; forming a gate electrode on the first insulating layer in the active region; foxing a layer of a heat sensitive fluid material on the gate electrode; carrying out a first ion implantation into the substrate; carrying out a first heat treatment on the heat sensitive layer; carrying out a second ion implantation into the substrate; removing the residual fluid material; forming a second insulating layer on the whole surface of the wafer; and carrying out a second heat treatment on the wafer.

18 Claims, 8 Drawing Sheets

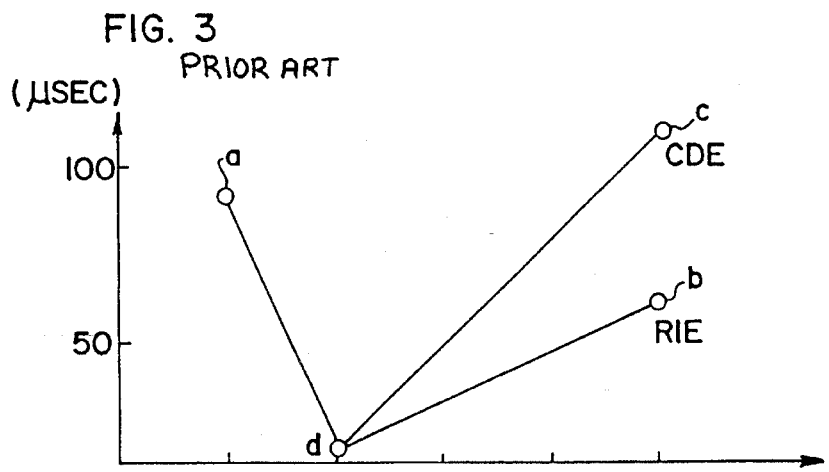
FIG. 3 PRIOR ART
FIG. 4 PRIOR ART
DEPENDENCE OF JUNCTION LEAKAGE ON CLEANING METHODS
| ETCH | CLEANING METHOD | JUNCTION LEAKAGE (nA AT 3.3V) |
|---|---|---|
| DRY + WET ETCH | SC1 + HF | 4.1 |
| 10% OVER ETCH | SC1 + HF | 6.4 |
| 30% OVER ETCH | SC1 + HF | 60.0 |
| 30% OVER ETCH | SILICON LIGHT ETCH + SC1 + HF | 4.0 |
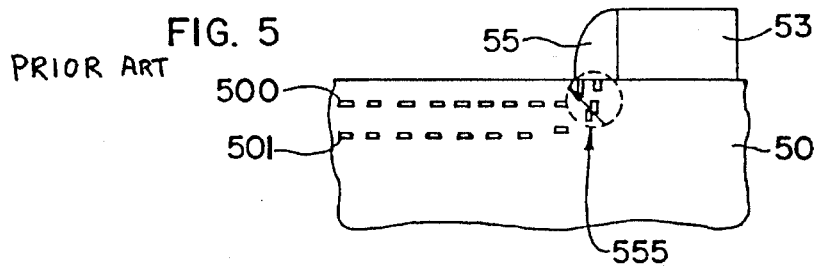
FIG. 5 PRIOR ART

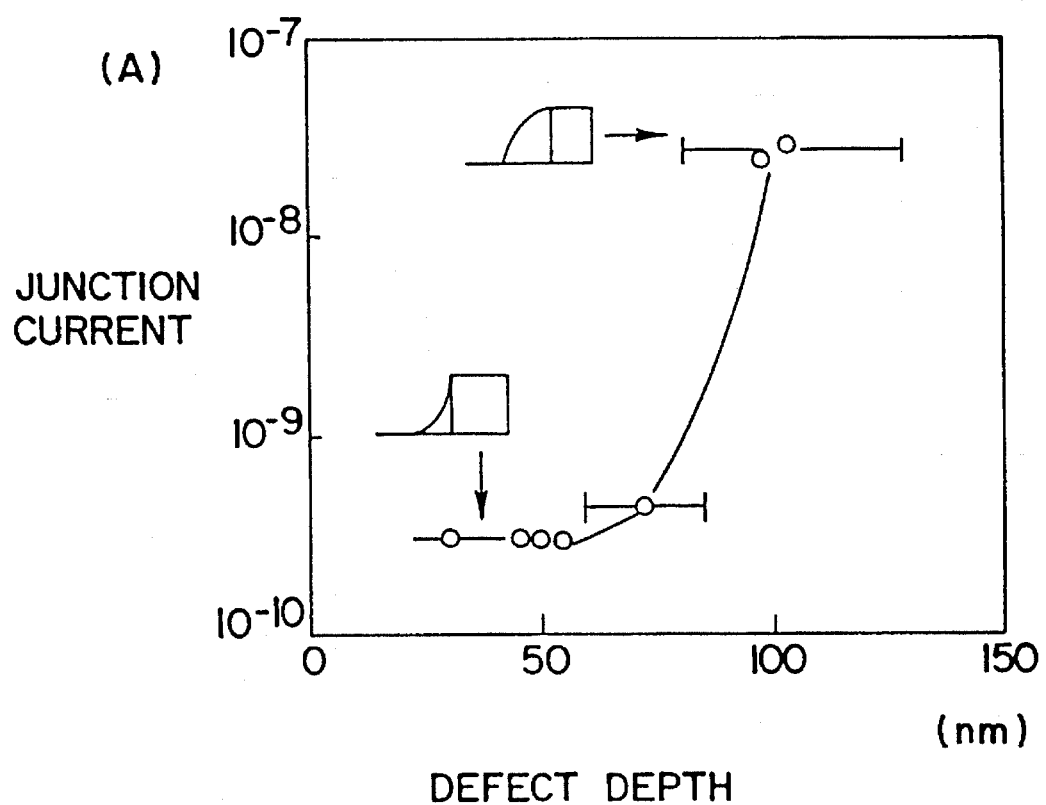

PROCESS FOR MAKING A SEMICONDUCTOR MOS TRANSISTOR USING A FLUID MATERIAL

FIELD OF THE INVENTION

The present invention relates to processes for making semiconductor devices, and more particularly to processes for forming MOS field effect transistors (FETs) having a lightly doped drain (LDD) in a high density device.

BACKGROUND OF THE INVENTION

Generally, a semiconductor integrated circuit requires high circuit performance and high density. Therefore, in the case of a metal oxide semiconductor field effect transistor (or "MOSFET"), the technology for the forming a semiconductor integrated circuit has been scaled down to a sub-micron range as a result of the efforts to reduce the size of the device. Only through a reduction of the horizontal dimension and a proportionate reduction of the vertical dimension, can a functional equilibrium between various devices be achieved. That is, if the distance between the source and drain is reduced as a result of the reduction of the size of the device, an undesirable variation of the characteristics of the device occurs, a typical example being the short channel effect. If this short channel effect is to be overcome, a horizontal scale-down has to be carried out; that is, the gate length has to be reduced. Further, a vertical scale-down has to be carried out; that is, the thickness of the gate insulation dielectrics and the depth of the junction and the like have to be reduced. Further, the applied voltage has to be lowered, and the doping concentration of the semiconductor substrate has to be increased. Particularly, the doping profile for the ion implantation depth of the channel region has to be controlled. The applied voltage for the semiconductor device, however, has to satisfy the power source for the electronic apparatus in which the semiconductor device is used. Therefore, while the dimension of the semiconductor device is scaled down, the electrical dimension for the applied power source of the circuit is not reduced. In the case of a MOS device, particularly in the case of an NMOS transistor, the distance between the source and drain is reduced as a result of the reduction of the channel. Accordingly, the electrons which are supplied from the source are abruptly accelerated by a high electric field near a pinch-off region near the channel of the drain junction, thereby producing hot carriers. Thus, the NMOS transistor is vulnerable to these hot carriers. (Refer to Chenming Huet et al, "Hot-electron-induced MOSFET Degradation-Motel, Monitor and Improvement", IEEE Transactions on Electron Devices, Vol. ED-32, No. 2, February 1985, pp. 375–385).

According to the above cited paper, the instability of hot carriers is caused by a high electric field near the drain junction, which is caused by the short channel length and the high applied voltage. Hot carriers thus generated are injected into the gate insulating layer, which can result in substrate current. Therefore, an LDD (lightly doped drain) structure was proposed in 1978, which improves the NMOS device which is subject to hot carriers and has a reduced channel length. (Refer to K. Saito et al, "A New Short Channel MOSFET with Lightly Doped Drain", denshi tsushin rengo taikai (in Japanese), April 1978, p. 220).

The LDD structure has characteristics such that the side length is narrow, and a self-aligned lightly doped $n^-$ region is disposed between the channel and the highly doped $n^+$ source/drain region. This $n^-$ lightly doped region spreads out the high electric field near the drain junction, so that carrier electrons supplied from the source are not abruptly accelerated, thereby overcoming the current instability due to hot carriers. Since studies on semiconductor devices of over 1 mega-bit DRAMs have begun, techniques for manufacturing MOSFETs having an LDD structure have been proposed in various forms. Of them, the most typical one is that in which the LDD is formed by providing a side wall spacer on each of the side walls of the gate, and this technique is being used in most mass production devices.

FIG. 1 illustrates a conventional process for forming an NMOS transistor having an LDD structure.

First referring to FIG. 1A, active region 10a and isolated region 10b are formed upon silicon substrate 10. Gate insulating layer 12 is formed on the surface, and polysilicon layer 13' is formed thereupon. Cap gate oxide layer 14' is formed on polysilicon layer 13'.

As illustrated in FIG. 1B, cap gate oxide layer 14' and polysilicon layer 13' are etched by applying a photo etching method, thereby forming gate (electrode) 13 over which is oxide layer 14.

As illustrated in FIG. 1C, an ion-implantation (phosphorus ion) is carried out on the whole surface with a light dose and with a low implanting energy to form $n^-$ region 101.

As illustrated in FIG. 1D, silicon oxide layer 15 is deposited on the whole surface by applying a chemical vapor deposition method (CVD) in order to form side wall spacers.

Thereafter, as illustrated in FIG. 1E, the whole surface is etched back by applying a reactive ion etching (RIE) process so that a part of silicon oxide layer 15 remains on the side faces of cap gate oxide layer 14 and gate 13. In this process, gate insulating layer 12 which is not protected by the gate also is etched, thereby exposing the surface of the silicon substrate. Thus, side wall spacer 15' consisting of a part of silicon oxide layer 15 and a part of gate insulating layer 12 is formed on the side walls of cap gate oxide layer 14 and gate 13.

Thereafter, as illustrated in FIG. 1F, an n-type dopant ion implantation is carried out with a large dose, thereby forming source/drain region 102 doped ($n^+$) with a high concentration and having a deep junction. Under this condition, gate side wall spacer 15' plays the role of a barrier during the high concentration ion implantation for forming the source/drain region. Therefore, $n^-$ junction 101', which is not affected by the high concentration doping, if formed between channel C of the gate and source/drain region 102. (Refer to Paul J. Tsang et al, "Fabrication of High Performance LDDFET's with Oxide Sidewall-Spacer Technology" IEEE Transactions on Electron Devices, Vol. ED-29, No. 4, April 1982).

There are, however, several problems in forming LDD devices by providing gate side wall spacers. Particularly, this technology is not suitable for future formation of semiconductor devices requiring high density and high prestige.

In this technique, in order to form a gate side wall spacer, deposition of an oxide is carried out by applying a CVD method, followed by an etch-back. Therefore, during this etching, the active region of the silicon substrate is exposed, and contaminated. Further, the active region of the silicon substrate is over-etched, thereby damaging the silicon substrate. Further, the over-etched depth is not uniform over the positions of the silicon wafer in accordance with the density of the patterns and, therefore, the electrical characteristics of the semiconductor device become non-uniform.

That is, as illustrated in FIG. 2, plasma radical species such as CF3, CHF3 and $O_2$ used during the etching of the oxide layer intrude into the silicon substrate. Therefore, although varying depending on the RF power during etching, a compound layer of about 500 Å is formed, the compounds including $CF_x$- polymers, Si—C, Si—O, Si—O—C.

FIG. 2 is a graphical illustration of the results of analysis using a secondary ion mass spectroscopy (SIMS) for the case where the plasma radical species intrude into the silicon substrate to contaminate the substrate during the etching of the oxide layer by using CF3, CHF3, $O_2$ and the like based on the conventional technique.

In the graph, the X axis illustrates the depth from the silicon surface, i.e., the value of the projection range as against the sputtering time, while the Y axis illustrates the concentration without unit in relative terms and in a logarithmic value. As can be seen from the graph, the concentrations of fluorine, oxygen and carbon near the surface of the silicon are higher than the concentration of the silicon and, therefore, these elements form a compound layer of about 500 Å from the surface, the compounds being such as $CF_x$-polymers, Si—C, Si—O, and Si—O—C.

In high density devices requiring a shallow junction, the bonding sites of the above-mentioned compounds exist within a depletion region when power is applied to the junction. Therefore, such bonding sites serve the role of a trap center for generating carriers, resulting in an increase in junction leakage current.

These findings are disclosed in Jeong Kim et al., "Cleaning Process for Removing of Oxide Etch Residue," Proceedings of Contamination Control and Defect Reduction in Semiconductor Manufacturing I, pp. 408–415, 1992, Toronto, and are summarized in FIG. 3 and FIG. 4 (table 4.)

FIG. 3 is a graphical illustration of the variation of the lifetime of minority carriers (a time during which the minority carriers exist in silicon) according to etch processes of the side wall oxide. As illustrated in FIG. 3, the lifetime of the minority carriers are recovered to the original state of the silicon wafer, that is, about 100 μs, similar to the value before etching it. In FIG. 3, the "a" point indicates a lifetime (minority carrier lifetime) in the raw wafer itself (substrate) prior to etching the oxide side wall process. The "d" point indicates a lifetime in the wafer after etching the oxide side wall process by an RIE (reactive ion etch), thus receiving damage. The "b" point indicates a lifetime in the wafer in which the damaged portion is removed by an RIE process. The "c" point indicates a lifetime in the wafer in which the damaged portion is removed by a CDE (low damage Chemical Dry Si substrate Etch) process. The minority carrier lifetime is reduced to about 10 μs ("d" point) just after the etch of the oxide to form the side wall spacer. The damaged substrate is restored to over 100 μs ("c" point) by carrying out a low damage chemical dry etch. Further, if the damaged substrate is removed by a reactive ion etch (RIE), then the lifetime is improved to over 50 μs ("b" point). That is, if the damaged or contaminated portions are removed, the quality of the silicon substrate is restored to the original level.

FIG. 4 illustrates the dependence of junction leakage current on cleaning methods during formation of the gate side wall spacer. As can be seen from FIG. 4, if the silicon substrate is excessively etched, the damaged region increases, and, therefore, junction leakage also increases. If the etch-damaged or contaminated portions are removed, however, the junction characteristics are improved. In other words, in conventional technology in order to make the junction area beside the gate side wall free from damage, an over etch and low damage chemical dry etch process is required.

There is another problem with the conventional technique. Junction leakages were caused by dislocation lines which are across the junction layer from the side wall edge in MOS devices with an LDD structure.

As illustrated in FIG. 5, the gate side wall spacer is generally formed almost vertical relative to the silicon substrate and, therefore, the stress is concentrated on the corner where the side wall spacer meets the silicon substrate. Therefore, as indicated by dislocation line 555, which is formed from the corner of the spacer to the bulk of the substrate, a crystal defect is formed. This dislocation line increases the leakage current of the junction, and the data retention property is aggravated.

FIG. 5 is a sectional view of a MOSFET having an LDD structure and a silicon dioxide gate side wall spacer in the conventional semiconductor device.

Dislocation loops 500 and 501 which are formed during an $As^+$ ion implantation and subsequent annealing appear on silicon substrate 50 in the form of a loop. Crystal defect 500 of the upper layer is positioned at the depth center $R_p$ of the impurity ions, while crystal defect 501 of the lower layer is positioned at a boundary depth between the non-crystalline and crystalline portions. Particularly, stress generated by differences in thermal properties is concentrated on the corners of side wall spacer 55 of gate 53, with the result that a crystal defect is generated as indicated by dislocation line 555.

It is predicted that such a crystal defect is caused when the thermal stress becomes larger than the silicon bonding energy. Therefore, as illustrated in FIGS. 6A and 6B, the distribution of the stress becomes different in accordance with the shape of the gate side wall spacer.

FIGS. 6A and 6B illustrate the stress distribution from the gate side wall spacer to the silicon substrate of an NMOS-FET having an LDD in a conventional semiconductor device.

Referring to FIG. 6A, a crystal defect in impurity diffusion layers 600 and 601 results from side wall spacer 65 due to the difference between the thermal expansion rates of silicon substrate 60 and gate side wall oxide layer 65. When the steeply shaped side wall is formed, the stress is concentrated at the side wall edge and indicates a value of about $5.4 \times 10^9$ dyn/cm$^2$. This stress exceeds the bonding energy of the crystal, thereby leading to defect "S" in FIG. 6A. That is, the magnitude of the stress becomes larger than the silicon bonding energy, with the result that dislocation "S" occurs.

Referring to FIG. 6B, if the side wall spacer is less steeply shaped, the stress is concentrated at the side wall edge and indicates a value of about $2.7 \times 10^9$ dyn/cm$^2$. Thus a defect depicted "S'" in FIG. 6B occurs only a little. Here also side wall spacer 65' at gate 63' affects diffusion layers 600' and 601' due to thermal expansion differences between silicon substrate 60' and gate side wall oxide layer 65'.

In short, the stress imposed on the silicon substrate is varied within the range of about $2.7 \times 10^9$–$5.4 \times 10^9$ dyn/cm$^2$ in accordance with the shape of the gate side wall spacer and the angle between the spacer and the substrate. The steeper the side wall spacer relative to the substrate, the more frequent the crystal defect, i.e., the more frequent the dislocation. (Refer to Shigeo Onishi et al., "Formation of a Defect Free Junction Layer by Controlling Defects Due to $As^+$ Implantation" IEEE/ERPS, 1991, pp. 255–259.)

FIG. 8 is a graphical illustration of the junction leakage current versus dislocation depth in the side wall spacer.

The X axis illustrates the depth of the dislocation line based on the profile of the conventional gate side wall spacer, while the Y axis illustrates the magnitude of the leakage current. It is seen that the greater the steepness of the side wall spacer, the greater the leakage current.

As the size of the device is scaled down, the acceptable tolerance is reduced. Therefore, there are still unsolved problems in that plasma species intrude into the substrate during deposition of the oxide layer based on a CVD process (which is the critical step in the formation of the gate side wall spacer), and during the etching due to the over-etch. Another problem is the degradation of the device characteristics (such as leakage current at the junction layer) due to the crystal defect such as dislocations attributed to the profile of the side wall spacer. Therefore, a study is being carried out for improving the manufacturing process for an LDD device utilizing a conventional side wall spacer.

Also another study is being carried out for obtaining a solution to the problems of forming an LDD device utilizing the side wall spacer based on a substitution method.

FIGS. 7A to 7C illustrate an improvement of the conventional technique of forming an LDD transistor by adding an etch stop layer and utilizing a side wall spacer.

As illustrated, gate 73 is patterned, and etch stop layer 777 (polysilicon or Si3N4) is formed on gate insulating and pad oxide layer 72 to protect silicon substrate 70 during etchback of CVD $SiO_2$ for forming side wall spacer 75. Then CVD $SiO_2$ 75 is deposited and etched back, so that an excessive etch of the silicon substrate and contamination of the etchant with plasma species are prevented. In the last step illustrated in FIG. 7C, in order to form a highly doped impurity region n+, an ion implantation is carried out, after removing spacer 75.

This conventional technique, however, cannot give a solution to the problem of the defect of crystal dislocation which is caused by the profile of the side wall spacer.

Another method suggested in U.S. Pat. No. 4,599,118 is an overhang technique where a stacked structure of $SiO_2$/Si3N4/polysilicon/$SiO_2$ is gate-patterned and the polysilicon is excessively etched, thereby forming an $SiO_2$/Si3N4 overhang. An $As^+$ source/drain ion implantation is carried out using the overhang as an ion implantation mask, and the overhang is removed in order to carry out an $n^-$ ion implantation for forming an $n^-$ region.

In brief, the scaled-down transistors come to have short channels, with the result that hot carriers are produced, thereby raising the problem of hot carrier instability. In order to overcome this problem, a transistor having an LDD has been proposed, and in the practical fields, the LDD was formed utilizing a gate side wall spacer. In high density devices of over 16 mega-bit DRAMs, however, the LDD device formed by utilizing a side wall spacer has become unsuitable for the reasons cited above.

Summary of the Invention

According to the present invention, a MOSFET with an LDD structure is formed without a side wall spacer, thereby solving problems caused by the side wall spacer.

It is an object of the present invention to provide a process for forming a MOS semiconductor device having an LDD structure which is suitable for a VLSI (very large scale integrated circuit), and in which the above described disadvantages of the conventional techniques are overcome.

In the present invention, the LDD structure is formed without using a side wall spacer as an ion implantation inhibition layer.

In achieving the above object, the process for forming an LDD MOSFET according to the present invention includes the steps of: forming an active region and an isolated region on a semiconductor substrate; forming a first insulating layer on the whole surface of the wafer; forming a gate electrode on the first insulating layer in the active region; forming a layer of a heat sensitive fluid material on the gate electrode; carrying out a first ion implantation on the whole surface of the wafer; carrying out a first heat treatment on the heat sensitive layer; carrying out a second ion implantation on the whole surface of the wafer; removing the residual fluid material; forming a second insulating layer on the whole surface of the wafer; and carrying out a second heat treatment on the wafer.

In a more detailed summarization, the process according to the present invention includes the steps of: forming an active region and an isolated region on a semiconductor substrate in a general CMOS formation sequence; forming a gate insulating layer in the form of an oxide layer on the whole surface of the wafer; depositing a polysilicon layer on the gate insulating layer for forming a gate electrode; forming a fluid layer by heating the polysilicon layer; forming a gate wiring having the same pattern by utilizing the polysilicon layer, i.e., the fluid layer; carrying out a first ion implantation on the whole surface of the wafer for forming an LDD structure; carrying out a heat treatment on the gate wiring portion so as for the fluid material to flow, and so as for the sectional area parallel with the semiconductor substrate to become larger than the original cross sectional area (under this condition, a source/drain region is self-aligned); carrying out a second ion implantation for forming a source/drain region; removing the residual fluid material; forming an oxide layer on the whole surface of the wafer; and carrying out a heat treatment on the wafer.

BRIEF DESCRIPTION OF THE DRAWINGS

The above object and other advantages of the present invention will become more apparent by describing in detail the preferred embodiments of the present invention with reference to the attached drawings in which:

FIG. 2 is a graphical illustration of the results of an analysis of an over-etched silicon substrate using SIMS (secondary ion mass spectroscopy) and illustrating the contamination of the silicon substrate by the intruding plasma radicals during the etch of the oxide layer using gases of CF3, CHF3, $O_2$ and the like;

FIG. 3 is a graphical illustration of the variation of the lifetime of the minority carriers according to various etch processes of the side wall oxide;

FIG. 4 is a table illustrating the dependence of junction leakage current on various cleaning methods during formation of the gate side wall spacer;

FIG. 5 is a partly sectional view of an NMOSFET having an LDD structure in a conventional semiconductor device;

FIG. 8 illustrates junction leakage current versus the dislocation line depth in the substrate.

DESCRIPTION OF THE PREFERRED EMBODIMENTS

Referring to FIGS. 9A to 9F, preferred embodiments of the present invention will be explained.

Figure 9A:
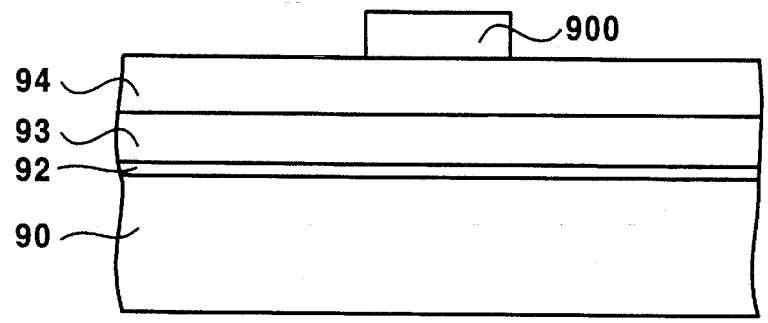
FIGS. 9A to 9F are a partly sectional views illustrating a process for formation of a MOS field effect transistor having an LDD structure according to the present invention.

First, as illustrated in FIG. 9A, an active region (reference numeral not shown) and an isolation region (not shown) are formed on semiconductor substrate 90 in a general CMOS device formation sequence. Insulating layer 92 composed of silicon oxide (which is an insulating material) is grown to a thickness of about 100 Å.

In-situ doped polysilicon layer 93 is deposited to a thickness of about 2500 Å on gate insulating layer 92 by applying an LPCVD (low pressure chemical deposition) method. Heat is applied to polysilicon layer 93 and, at the same time, a BPSG layer (boron phosphorous silicate glass layer, which is a fluid material; i.e., a heat sensitive layer) as flowing material layer 94 is deposited to a thickness of about 3000 Å. Photo resist is applied on BPSG layer 94, and photo resist pattern 900 is defined through exposing and developing, utilizing a gate electrode forming mask.

Figure 9B:
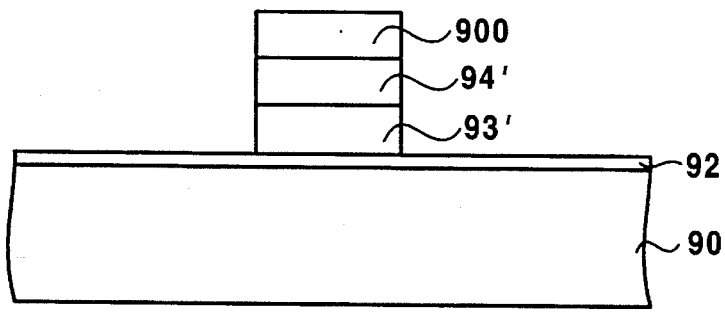

As illustrated in FIG. 9B, an anisotropic etching is carried out on the whole surface by utilizing pattern 900 and gate insulating layer 92, so that BPSG layer 94 and polysilicon layer 93 which are not protected by photo resist pattern 900 are removed, thereby forming BPSG 94'/gate 93' pattern having a stacked structure in the form of BPSG/polysilicon.

Figure 9C:
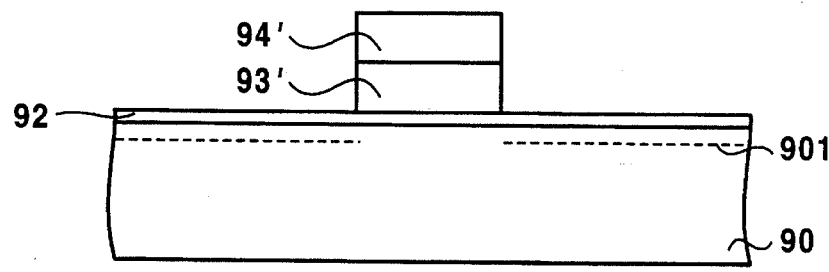

As illustrated in FIG. 9C, photo resist pattern 900 is removed, and a first ion implantation is carried out on the whole surface using phosphorus ions for forming an n⁻ LDD region, under the conditions of a concentration of about $2.0 \times 10^{13}$ ions/cm², and an acceleration energy of about 30 KeV. Thus, lightly doped phosphorus ion impurity buried layer 901 is formed in the active region of silicon substrate 90, excluding the area of the BPSG 94'/gate 93' electrode pattern, after the phosphorus ions have passed through gate insulating layer 92. Buried layer 901 will become an LDD junction after going through a diffusion step. Under this condition, the surface of silicon substrate 90 is protected by gate insulating layer 92 and, therefore, it is not affected by the first ion implantation.

Figure 9D:
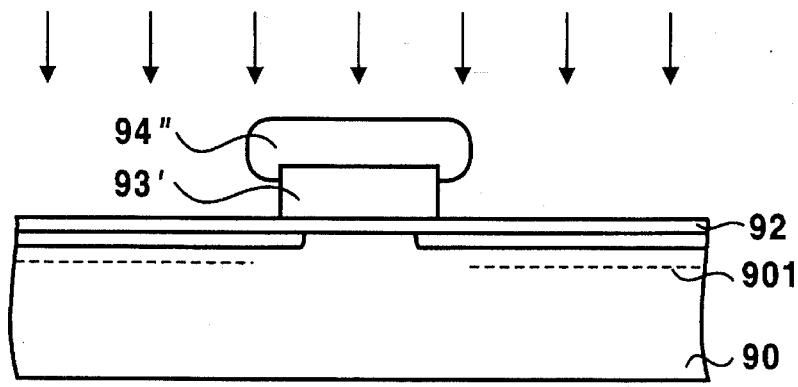

As illustrated in FIG. 9D, a flow is carried out for about 10 minutes within a heat diffusion furnace under an N₂ atmosphere and at a temperature of about 850° C., so that residual BPSG 94' which is on gate electrode 93' becomes fluid. BPSG 94" which has undergone the flowing comes to have a spread shape like a water drop due to gravity and the surface tension of the BPSG material. The sectional area of BPSG layer 94" (which has gone through flowing) in the direction parallel with substrate 90 becomes larger than the sectional area of gate 93' in the direction parallel with substrate 90. Thus, it becomes like a mushroom, so that it may serve as an ion implantation inhibition layer when carrying out an ion implantation for forming a source/drain region.

A second ion implantation is carried out under the conditions of a concentration of about $5.0 \times 10^{15}$ ions/cm² and an acceleration energy of about 40 KeV using As⁺ ions serving as carriers.

Figure 1A:
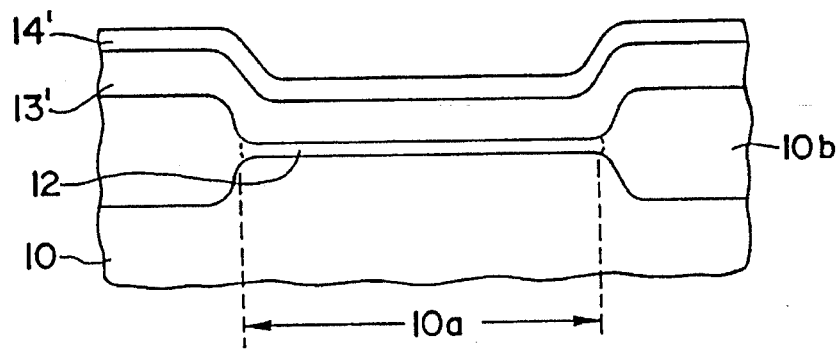
FIGS. 1A–1F illustrate a process for formation of an NMOS transistor having an LDD structure based on a conventional technique.
Figure 1B:
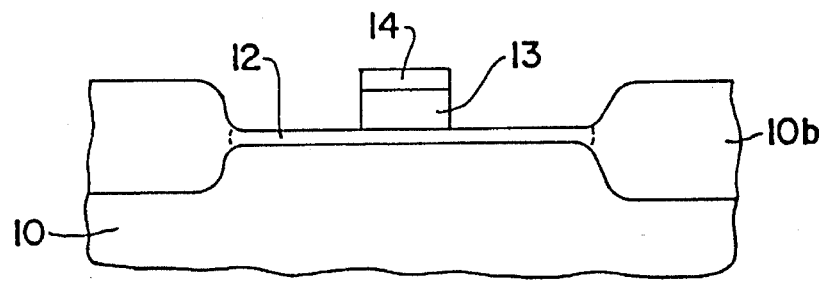
Figure 1C:
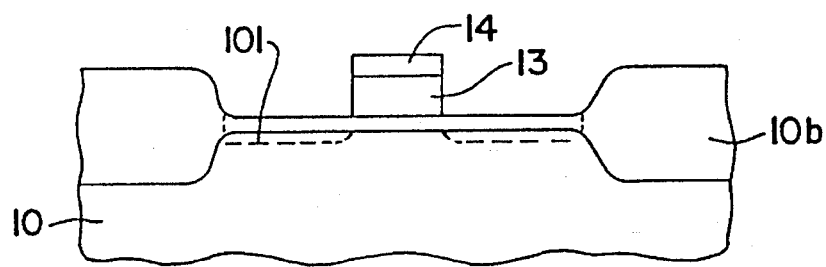
Figure 1D:
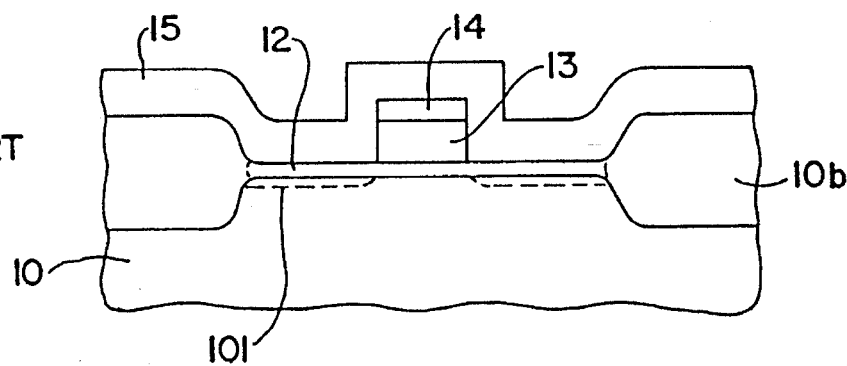
Figure 1E:
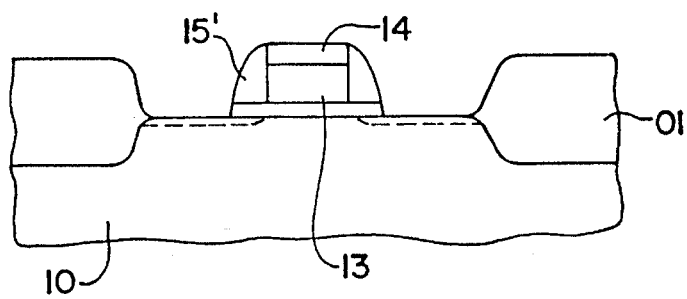
Figure 1F:
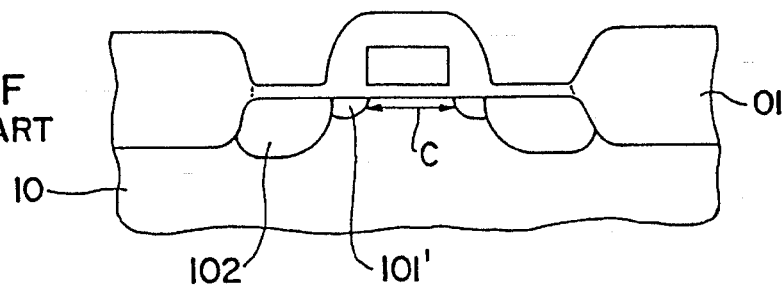
Figure 2:
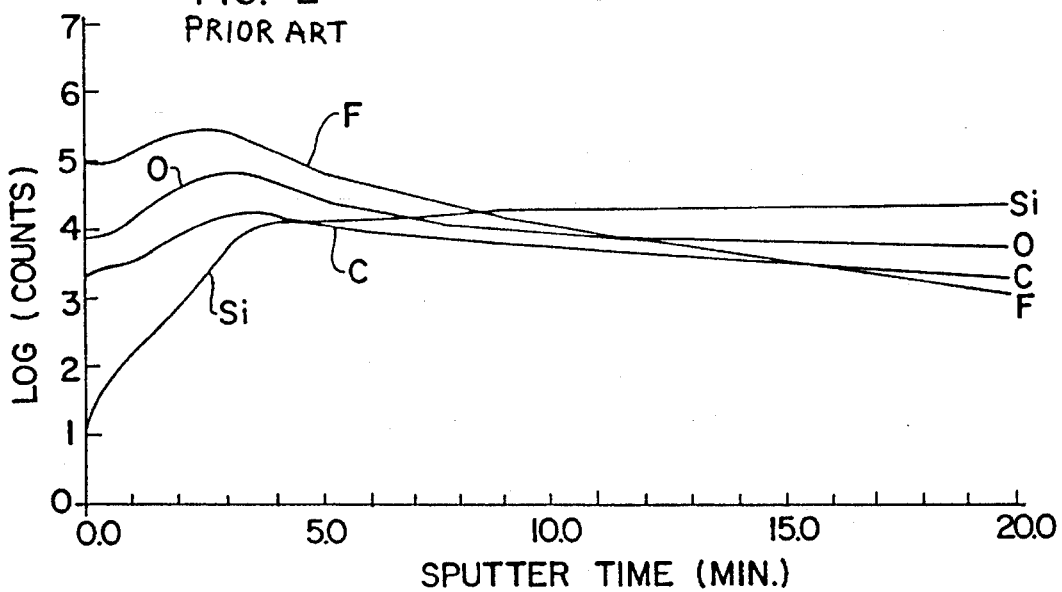
Figure 6A:
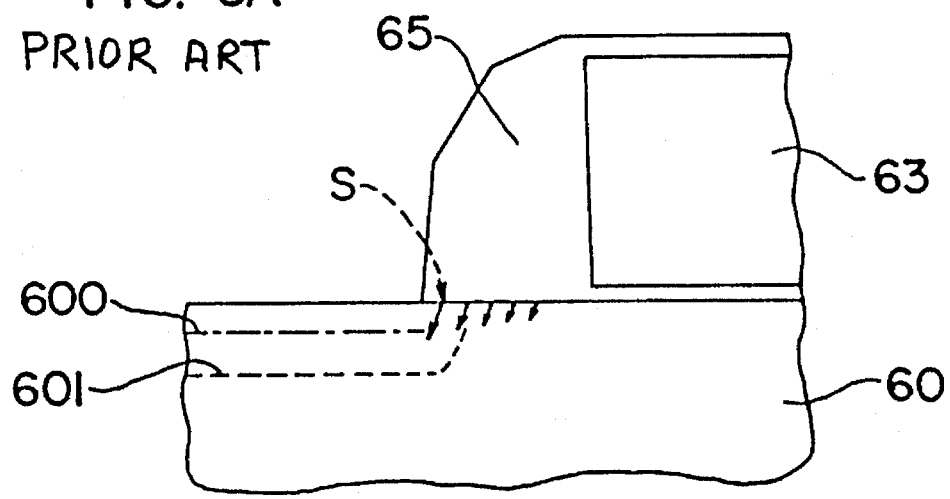
FIGS. 6A–6B illustrate the distribution of the stress from the gate side wall to the silicon substrate for an NMOSFET having an LDD structure in a conventional semiconductor device.
Figure 6B:
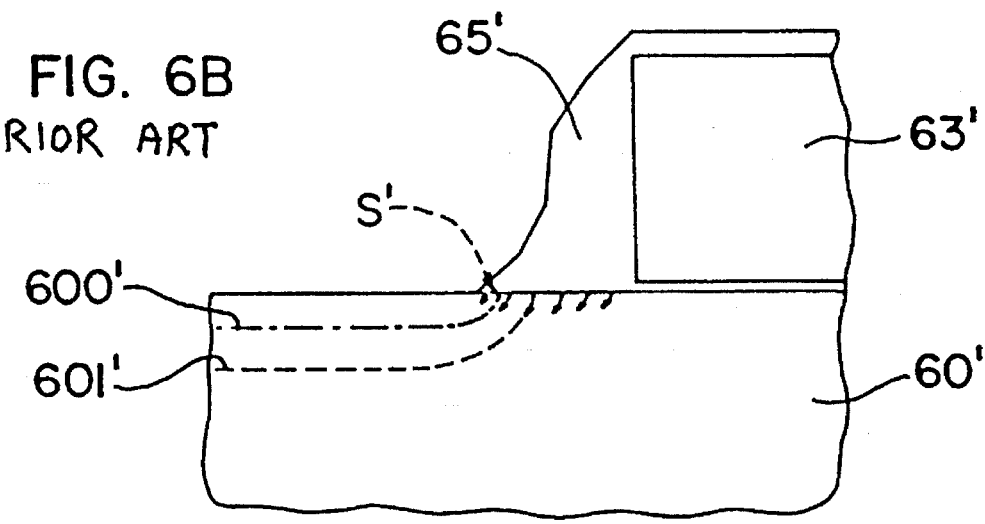
Figure 7A:
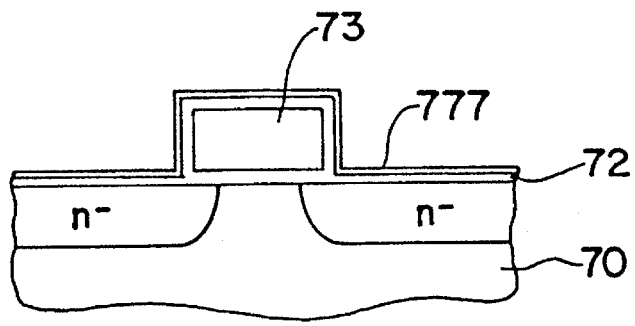
FIGS. 7A–7C illustrates a process for formation of an LDD transistor using a side wall spacer and adding an etch stop layer as an improvement of the conventional techniques.
Figure 7B:
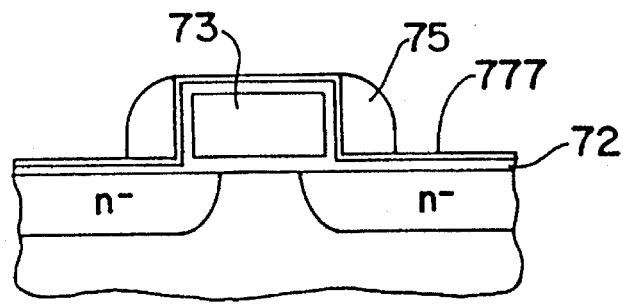
Figure 7C:
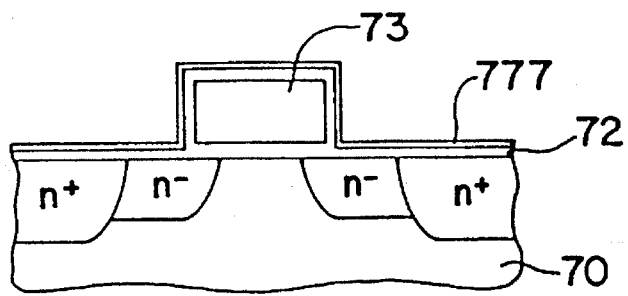

Under this condition, the surface of silicon substrate 90 is protected by gate insulating layer 92, and the process for forming the side wall spacer is not required as in the conventional process. Therefore, the problems illustrated in FIGS. 2, 3 and 4 are not encountered. That is, with a conventional process, the bonding sites of the chemical compounds produced through contamination during etching exist within a depletion region with power supplied to the junction, which therefore serve as a trap center for carriers, with the result that the leakage current of the junction is increased. (Refer to Jeong Kim et al, "Cleaning Process for Removing of Oxide Etch Residue", Proceedings of Contamination Control and Defect Reduction in Semiconductor Manufacturing I, pp. 408–415, 1992, Toronto.)

Under this condition, the source/drain region is self-aligned owing to over-sized BPSG 94" which has gone through flowing.

Thus, unlike the conventional technique, a gate side wall spacer is not utilized as an ion implantation inhibiting layer and, therefore, the problem of etchant (i.e., plasma species) produced during the formation of the gate side wall spacer intruding into the substrate is avoiding, thereby preventing contamination of the substrate.

Further, as illustrated in FIG. 5, the gate side wall spacer is formed perpendicularly relative to the silicon substrate and, therefore, stress is concentrated on the corner portions, with the result that a dislocation line is formed from the corner of the spacer to the bulk of the substrate. Such a dislocation line affects the leakage current of the junction and the data retention property. According to the present invention, the property deterioration due to crystal defects and stress caused by the profile of the side wall spacer is prevented.

Figure 9E:
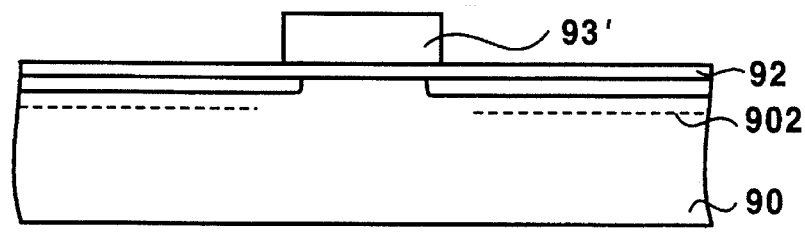

As illustrated in FIG. 9E, BPSG layer 94" which has gone through the flowing process is dipped into an HF solution in order to be removed by wet etching.

Figure 9F:
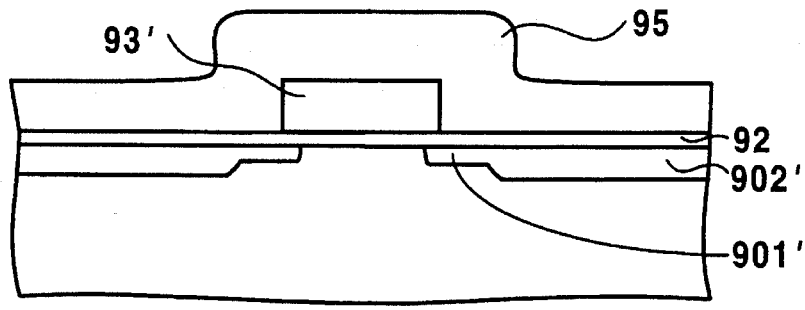

As illustrated in FIG. 9F, oxide (SiO₂) layer 95 is deposited on the whole surface to a thickness of about 2000 Å by applying a CVD method. A heat treatment is carried out at a temperature of about 850° C. for about 30 minutes for activating and diffusing the impurity ions which are implanted into the source/drain regions. Thus, n⁻ type LDD region 901' and n⁺ type source/drain region 902' are formed, thereby completing the major steps of the present invention, and completing the NMOS field effect transistor having an LDD structure according to the present invention.

As to impurity ion implantation process, in the case of an NMOS device, the first ion implantation for forming the LDD region is carried out using phosphorus ions under the conditions of an ion concentration of about $5.0 \times 10^{12}$–$5.0 \times 10^{13}$ ions/cm² and an acceleration energy of about 10–40 KeV. In the case of a PMOS device, the first ion implantation for forming the LDD region is carried out using boron ions under the conditions of an ion concentration of about $5.0 \times 10^{12}$–$5.0 \times 10^{13}$ ions/cm² and an acceleration energy of about 10–40 KeV.

In the case of an NMOS device, the second ion implantation for forming a source/drain region is carried out using As⁺ ions under the conditions of an ion concentration of about $1.0 \times 10^{15}$–$1.0 \times 10^{16}$ ions/cm² and an acceleration energy of about 10–40 KeV. In the case of a PMOS device, the second ion implantation for forming the source/drain region is carried out using B⁺ ions or BF₂⁺ ions under the conditions of an ion concentration of about $1.0 \times 10^{15}$–$1.0 \times 10^{16}$ ions/cm² and an acceleration energy of about 10–40 KeV.

According to the present invention as described above, the problems of the conventional techniques, in which a side wall spacer after deposition of CVD $SiO_2$ is formed, are solved. That is, the non-uniform excessive etching of the silicon substrate, the contamination of the silicon substrate by plasma species during the etching of the oxide layer, and the consequent degradation of the function of the device such as junction leakage current are all addressed. Further, there is inhibited the formation of the dislocation line (crystal defect) which grows toward the bulk of the substrate after being generated from the corner portion of the spacer by the stress due to the profile of the gate side wall spacer. Therefore, the problem of the leakage current can be solved. Thus, a MOS device having an LDD structure and satisfying the electric characteristics of a high density IC can be manufactured.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a MOSFET having an LDD structure, comprising the steps of:

forming a gate insulating layer on a semiconductor substrate;

forming a conductive layer on the gate insulating layer;

forming a fluid material layer comprising a heat sensitive fluid material on the conductive layer;

patterning the fluid material layer and the conductive layer, wherein the conductive layer is patterned to be a gate electrode;

carrying out a first ion implantation into the semiconductor substrate;

applying heat, wherein the fluid material layer flows and the sectional area of the fluid material layer parallel with the semiconductor substrate increases;

carrying out a second ion implantation into the semiconductor substrate;

removing the flowed fluid material layer;

forming an insulating over the gate electrode; and applying heat, wherein LDD regions in the semiconductor substrate result from the first and second ion implantations.

2. The process of claim 1, wherein the gate insulating layer comprises silicon oxide or silicon oxide and silicon oxide nitride layer.

3. The process of claim 1, wherein the conductive layer comprises in-situ doped polysilicon formed by an LPCVD method.

4. The process of claim 1, wherein the fluid material layer comprises boron phosphorus glass.

5. The process of claim 1, wherein the MOSFET is NMOS type, and the first ion implantation is carried out using phosphorus ions under the conditions of an ion concentration of about $5.0 \times 10^{12}$–$5.0 \times 10^{13}$ ions/cm$^2$, and an acceleration energy of about 10–40 KeV.

6. The process of claim 1, wherein the MOSFET is NMOS type, and the second ion implantation is carried out using arsenic ions under the conditions of an ion concentration of about $1.0 \times 10^{15}$–$1.0 \times 10^{16}$ ions/cm$^2$ and an acceleration energy of about 10–40 KeV.

7. The process of claim 1, wherein the MOSFET is PMOS type, and the first ion implantation is carried out using boron ions under the conditions of an ion concentration of about $5.0 \times 10^{12}$–$5.0 \times 10^{13}$ ions/cm$^2$ and an acceleration energy of about 10–40 KeV.

8. The process of claim 1, wherein MOSFET is PMOS type, and the second ion implantation is carried out using boron ions or $BF_2$ ions under the conditions of an ion concentration of about $1.0 \times 10^{15}$–$1.0 \times 10^{16}$ ions/cm$^2$ and an acceleration energy of about 10–40 KeV.

9. A process for formation of a transistor having an LDD structure, comprising the steps of:

forming a first insulating layer on a semiconductor substrate;

forming a gate electrode on the first insulating layer;

forming a heat sensitive layer comprising a heat sensitive fluid material on the gate electrode;

carrying out a first ion implantation into the semiconductor substrate;

carrying out a first heat treatment to cause flow of the heat sensitive layer on the gate electrode;

carrying out a second ion implantation into the semiconductor substrate;

removing the flowed heat sensitive layer;

forming a second insulating layer over the gate electrode; and carrying out a second heat treatment on the semiconductor substrate.

10. The process of claim 9, wherein the size of the flowed heat sensitive layer increases in the direction parallel with the semiconductor substrate as a result of the first heat treatment.

11. The process of claim 9, wherein the first insulating layer comprises silicon oxide.

12. The process of claim 9, wherein the gate electrode comprises in-situ doped polysilicon.

13. The process of claim 9, wherein the heat sensitive layer comprises borophosphorous silicate glass.

14. The process of claim 9, wherein the transistor is NMOS type, and the first ion implantation is carried out using phosphorus ions under the conditions of an ion concentration of about $5.0 \times 10^{12}$–$5.0 \times 10^{13}$ ions/cm$^2$ and an acceleration energy of about 10–40 KeV.

15. The process of claim 9, wherein the transistor is NMOS type, and the second ion implantation is carried out using arsenic ions under the conditions of an ion concentration of about $1.0 \times 10^{15}$–$1.0 \times 10^{16}$ ions/cm$^2$ and an acceleration energy of about 10–40 KeV.

16. The process of claim 9, wherein the transistor is PMOS type, and the first ion implantation is carried out using boron ions under the conditions of an ion concentration of about $5.0 \times 10^{12}$–$5.0 \times 10^{13}$ ions/cm$^2$ and an acceleration energy of about 10–40 KeV.

17. The process of claim 9, wherein the transistor is PMOS type, and the second ion implantation is carried out using boron ions or $BF_2$ ions under the conditions of an ion concentration of about $1.0 \times 10^{15}$–$1.0 \times 10^{16}$ ions/cm$^2$ and an acceleration energy of about 10–40 KeV.

18. The process of claim 10, wherein the second ion implantation is self-aligned with the flowed heat sensitive layer.

* * * * *